(12) United States Patent
Appelt et al.

(10) Patent No.: US 6,427,323 B2
(45) Date of Patent: Aug. 6, 2002

(54) METHOD FOR PRODUCING CONDUCTOR INTERCONNECT WITH DENDRITES

(75) Inventors: Bernd K. Appelt, Apalachin; Saswati Datta, Binghamton; Michael A. Gaynes, Vestal; John M. Lauffer, Waverly; James R. Wilcox, Vestal, all of NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/859,690

(22) Filed: May 17, 2001

Related U.S. Application Data

(62) Division of application No. 09/315,305, filed on May 20, 1999, now Pat. No. 6,256,874, which is a division of application No. 08/918,084, filed on Aug. 25, 1997, now Pat. No. 6,300,575.

(51) Int. Cl.[7] .................................................. H05K 3/36
(52) U.S. Cl. ........................... 29/830; 29/852; 174/250; 174/262; 174/266; 361/313; 361/301.4; 361/302
(58) Field of Search .......................... 29/830, 831, 832; 361/413, 414, 418, 784, 790, 791, 792, 748, 795, 771, 776, 779, 803, 313, 302, 301.4; 174/250, 256.5, 257, 258, 263, 264, 265, 266; 257/734, 739, 729, 780

(56) References Cited

U.S. PATENT DOCUMENTS

| 3,359,145 A | 12/1967 | Salyer ........................... 156/1 |
| 4,157,932 A | 6/1979 | Hirata ........................... 156/310 |
| 5,019,944 A | 5/1991 | Ishii et al. .................... 361/400 |
| 5,137,461 A | 8/1992 | Bindra et al. .................. 439/74 |
| 5,298,685 A | 3/1994 | Bindra et al. ................ 174/250 |
| 5,435,057 A | 7/1995 | Bindra et al. .................. 29/830 |
| 5,509,200 A | 4/1996 | Frankeny et al. ............. 29/852 |
| 5,531,022 A | * | 7/1996 | Beaman et al. ............... 29/850 |

FOREIGN PATENT DOCUMENTS

GB          1 568 464          2/1978

* cited by examiner

Primary Examiner—Carl J. Arbes
Assistant Examiner—Sean Smith
(74) Attorney, Agent, or Firm—James A. Lucas; Driggs, Lucas, Brubaker & Hogg Co., LPA

(57) ABSTRACT

A method is provided for connecting two conductive layers in an electronic circuit package comprising the steps of forming dendrites on selected regions of a first conductive layer, forming dendrites on selected regions of a second conductive layer, applying an epoxy adhesive material over the first conductive layer, and compressively attaching the second conductive layer to the first conductive layer such that the dendrites on the first conductive layer contact the dendrites on the second conductive layer. Also claimed is an electronic circuit package incorporating the dendrites used for electrical interconnection manufactured in accordance with the present invention. An alternative embodiment of the invention utilizes an intermediate surface metal with dendrites in place of a "through via."

9 Claims, 2 Drawing Sheets

METHOD FOR PRODUCING CONDUCTOR INTERCONNECT WITH DENDRITES

CROSS REFERENCE TO RELATED APPLICATIONS

This application is a divisional of application Ser. No. 09/315,305, filed May 20, 1999, now U.S. Pat. No. 6,256,874, which is a divisional of application Ser. No. 08/918,084, filed Aug. 25, 1997, now U.S. Pat. No. 6,300,575.

TECHNICAL FIELD OF THE INVENTION

The present invention relates to electronic circuit packages with dendrites connecting two conductive surfaces through a film and method for producing same. The dendrites electrically connect the two conductive surfaces and avoid the need for drilling or punching holes for vias or through-holes.

BACKGROUND OF THE INVENTION

Electronic circuits contain many (sometimes millions) of components such as resistors, capacitors, inductors, diodes, electromechanical switches, and transistors. High density packaging of electronic components is particularly important to allow fast access to large amounts of data in computers. High density electronic circuit packages also are important in high frequency devices and communications devices. The components are connected to form circuits and circuits are connected to form functioning devices. The connections perform power and signal distribution. In a multi-layer electronic circuit package, some layers of the package serve as power planes and other layers serve as signal planes, depending on the operational requirements of the device. The devices require mechanical support and structural protection. The circuits themselves require electrical energy to function. The functioning devices, however, produce heat, or thermal energy which must be dissipated so that the devices do not stop functioning. Moreover, while high density packaging of a number of components can improve performance of the device, the heat produced by the power-consuming components can be such that performance and reliability of the devices is adversely impacted. The adverse impact arises from electrical problems such as increased resistivity and mechanical problems such as thermal stress caused by increased heat.

Electronic circuit packages, such as chips, modules, circuit cards, circuit boards, and combinations of these, thus must meet a number of requirements for optimum performance. The package must be structurally sturdy enough to support and protect the components and the wiring. In addition, the package must be capable of dissipating heat and must have a coefficient of thermal expansion that is compatible with that of the components. Finally, to be commercially useful, the package should be inexpensive to produce and easy to manufacture.

High density packages necessarily involve increased wiring density and thinner dielectric coatings between layers in a multi-layer electronic circuit package. The layers in a multi-layer package typically are electrically connected by vias and through-holes. The term"via" is used for a conductive pathway between adjacent layers in a multi-layer electronic circuit package. The term"through-hole" is used for a conductive pathway that extends to a non-adjacent layer. For high density packages the through-holes are increasingly narrow in diameter and the through-holes in each layer must be aligned precisely. This invention provides an alternative means of interconnection—namely electrical interconnection using dendrites. Dendrite interconnection. avoids the need to drill or punch holes for vias or through-holes.

An object of this invention is to provide a means for connecting two conductors along the vertical or z-axis without using vias or through-holes, but still resulting in tight tolerances and high yield. Dendrite interconnections accomplish this purpose.

SUMMARY OF THE INVENTION

It is an object of this invention to provide an electronic circuit package with dendrites forming electrical connections between a first conductive layer and second conductive layer.

A further object of this invention is to provide an electronic circuit package that provides electrical connection in the z-axis using dendrites, thereby eliminating the need for drilling or punching through-holes or vias in the manufacturing process of the electronic circuit package.

A third object of this invention is to provide a method of fabrication of electronic circuit packages with dendrites forming electrical connections between a first conductive layer and a second conductive layer.

Accordingly, a method is provided for connecting two conductive layers in an electronic circuit package comprising the steps of forming dendrites on selected regions of a first conductive layer, forming dendrites on selected regions of a second conductive layer, applying an epoxy dielectric material over the first conductive layer, and compressively attaching the second conductive layer to the first conductive layer such that the dendrites on the first conductive layer contact the dendrites on the second conductive layer. Also claimed is an electronic circuit package incorporating the dendrites used for electrical interconnection manufactured in accordance with the present invention. An alternative embodiment of the invention utilizes an intermediate surface metal with. dendrites in place of a "through via."

It is an advantage of the present invention that the dendrites provide electrical connection between two conductive layers of the electronic circuit package.

It is a further advantage that the dendrites provide electrical connection in the z-axis using dendrites, thereby eliminating the need for photodefining, laser ablating, drilling or punching through-holes or vias in the manufacturing process of the electronic circuit package.

Other features and advantages of the present invention will become apparent in the following detailed description of the preferred embodiment of the invention taken in conjunction with the accompanying drawings and examples.

DETAILED DESCRIPTION OP THE INVENTION

The present invention is of an electronic circuit package using dendrites to provide connection between two conductive surfaces, thereby avoiding the need to photodefine, laser ablate, drill or punch through-holes or vias. The invention can best be understood by reference to the drawings.

Figure 1:
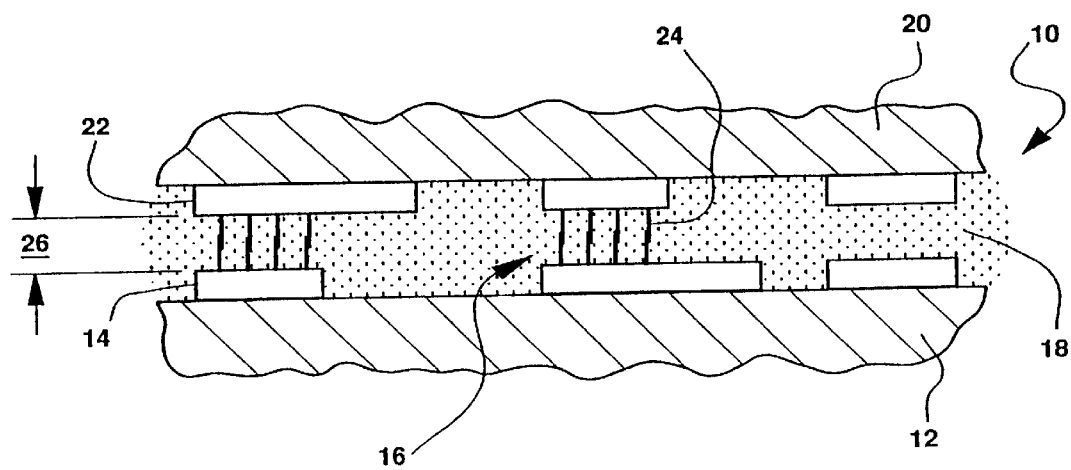
FIG. 1 is a depiction of a single layer of a multi-layer electronic circuit package using dendrites, rather than through-holes or vias, to electrically connect two conductive surfaces, in accordance with the present invention.

FIG. 1 illustrates a sample layer 10 of an electronic circuit package in accordance with the present invention. Referring to FIG. 1, at the bottom of the layer 10 is a first substrate 12. The first substrate 12 can be a printed circuit board core or a subcomposite. The first substrate 12 is preferably made of FR-4 type epoxy. A first surface metal 14 is situated on top of the first substrate 12 and covers some portion of the upper surface of first substrate 12. The first surface metal 14 forms a first conductive surface. In the preferred embodiment of the invention, the first surface metal 14 is made of a copper material.

Lower dendrites 16 are formed at selected locations on the first surface metal 14. The lower dendrites 16 preferably are made of palladium metal. Palladium metal possesses desired mechanical and physical properties. Other suitable metals for the lower dendrites include, but are not limited to, nickel or copper.

The lower dendrites may be formed by a variety of methods. One such method is to apply a photoresist material to the area of first surface metal 14 and then expose and develop the resist (not shown) by photolithographic techniques to provide an exposed area on which the dendrites are to be formed.

Typical photoresist materials are methacrylate polymeric resist compositions and electrohoretic resists such as those obtainable from Shipley or Nippon Paint.

According to a preferred method, an intermediate layer of nickel (not shown) is electroplated onto the first surface metal 14 followed by an intermediate layer of palladium, after applying resist material.

The nickel layer is typically about 1 to about 2.5 microns and more typically about 2 microns thick. The nickel covers the first surface metal 14 to prevent it from contaminating the palladium plating composition.

In addition this intermediate layer of palladium is typically about 1 to about 2.5 microns and more typically about 2 microns thick.

The lower dendrites 16 then are formed on the intermediate palladium layer by any known technique such as by ultrasonic plating of palladium typically at about 80 to 100 milliamps/cm$^2$ of surface area of first surface metal 14. It is preferred that the lower dendrites 16 are about 0.1 to 1.5 mil. in height. If desired, each of the lower dendrites 16 can be coated with a metal that could interface with or diffuse to form a metallic bond. For instance, the lower dendrites 16 can be coated with pure gold or with tin.

The photoresist is then removed by stripping in a suitable solvent such as propylene carbonate.

Once the lower dendrites 16 are formed, a layer of epoxy dielectric 18 is applied across the upper surface of substrate 12. The dielectric 18 thus covers the substrate 12, the first surface metal 14 and the lower dendrites 16. The adhesive dielectric layer 18 typically is in the range of 1 mil. to 5 mil. in thickness. In the preferred embodiment of the invention, the epoxy based dielectric 18 is Morton LB 404. Other suitable adhesives include, but are not limited to, BT-resin, polyimide, Teflon, and polysiloxanes. The dielectric may be applied by vacuum lamination, screen coating, curtain coating, or roller coating. In the preferred embodiment of the invention, the adhesive is applied by vacuum lamination of a dry film.

The top of the layer 10 is a second substrate 20. The second substrate 20 in the preferred embodiment of the invention, is made of epoxy glass. A second surface metal 22 is situated on the lower surface of second substrate 20 and covers some portion of second substrate 20. The second surface metal 22 forms a second conductive surface. In the preferred embodiment of the invention, the second surface metal 22 is made of a copper material.

The first substrate 12 and the second substrate 20 may be made of the same material, but are not required to be. The first surface metal 14 may be made of the same material as the second surface metal 22, but is not required to be.

Upper dendrites 24 are formed at selected locations on the second surface metal 22. The upper dendrites 24 typically are made in the same manner and have the same composition as the lower dendrites 16. However, this is not required. The upper dendrites preferably are formed to a height of 0.1 to 1.5 mil. If desired, the upper dendrites 24 also can be coated with a metal, as described above.

The second substrate 20, having the second surface metal and the upper dendrites 24, then is attached compressively to the first substrate 12 that has the dielectric layer 18. After compression, the separation 26 between the first surface metal 14 and the second surface metal 22 is about 0.2 to 2 mil. As a result of the compression, the upper dendrites 24 are in contact with the lower dendrites 16, thereby forming an electrical connection between the first surface metal 14 and the second surface metal 22.

The upper dendrites 24 penetrate the adhesive layer 18 without any need for pre-drilled holes. To facilitate the mating process of the upper dendrites 24 to the lower dendrites 16, the adhesive 18 may be heated to facilitate flow. The dielectric 18 will cure by heating after the mating is completed.

To achieve optimum electrical connection, the upper dendrites 24 should be positioned on the upper surface metal 22 to correspond with the position of the lower dendrites 16 on the lower surface metal 14. Registration tolerance is large. Overlap of 1 mil. is desirable as long as 1 mil. clearance to an adjacent conductor is maintained.

The advantages of the dendrites 16 and 24 shown in FIG. 1 are two-fold. First, the dendrites 16 and 24 provide an electrical connection between the first surface metal 14 and the second surface metal 22. Second, the electrical connection is achieved without the need to drill or punch and plate through-holes or vias thereby simplifying the manufacturing process.

Dendrites also can be used as electrical connectors when there are more than two layers involved. In an alternative embodiment of the invention, a circuitized core with dendrites formed in selected areas on it is deposited wherever a "through via" would exist in more traditional manufacturing. A "through via" is one that is intended to make contact with a conductor on the corresponding layer. The via in the core is used only to provide electrical connection for the dendrites for the through connection from surface metal on one substrate to surface metal on another substrate.

Figure 2:
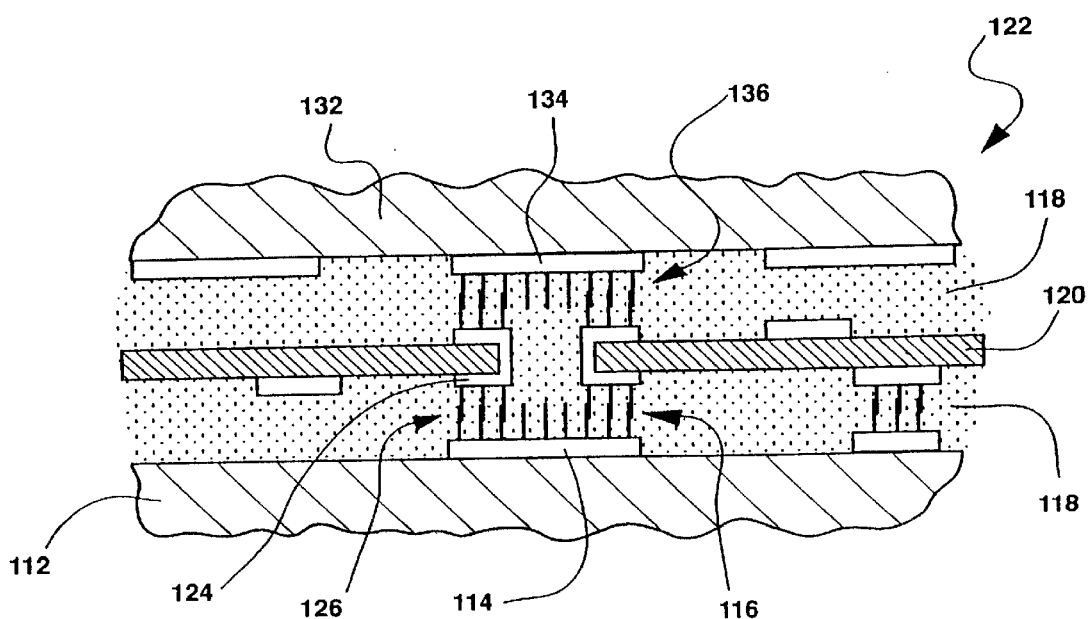
FIG. 2 is a depiction of two layers of a multi-layer electronic circuit package using dendrites to provide an electrical connection where a "through via" would exist in more traditional manufacturing.

FIG. 2 depicts the second embodiment of the invention. FIG. 2 shows a circuitized core 120 with a via 122. Surface metal such as 114, 124, and 134 is attached to certain areas of the circuit board core 120, the upper surface 132 and the lower surface 112. Dendrites 116, 126, and 136 are formed on selected areas of the surface metal 114, 124 and 134. A dielectric adhesive 118 holds the dendrites 116, 126, and 136 in position relative to each other. Dendrites in contact with each other thus form an electrical connection between the upper surface 132 and lower surface 112.

The entire process described with respect to the two embodiments can be repeated to create more layers interconnected by dendrites as described above.

Figure 3:
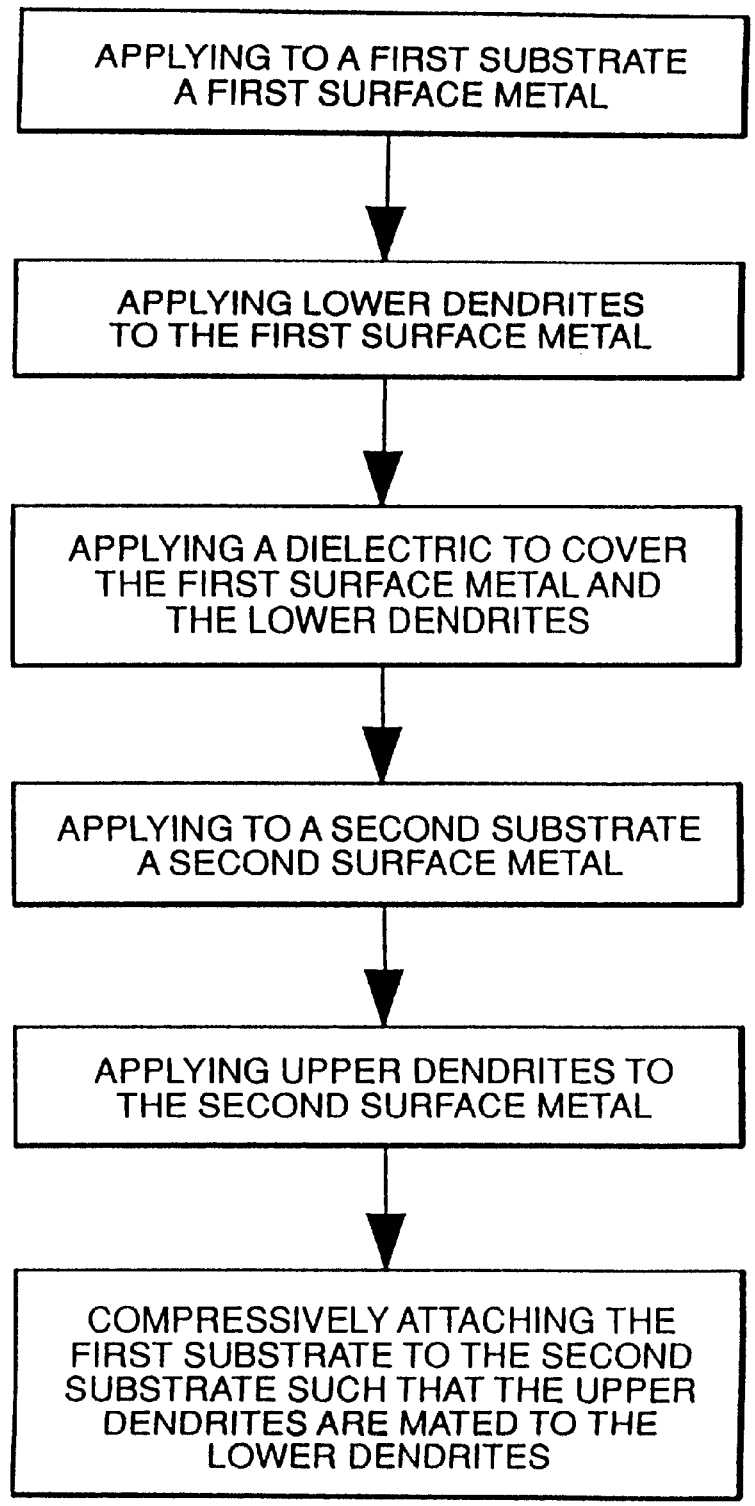
FIG. 3 is a flow chart of the method of the present invention.

FIG. 3 is a flow chart in accordance with the method of the present invention.

Although specific embodiments have been described herein for purposes of illustration, various modifications may be made without departing from the spirit or scope of the invention.

What is claimed is:

1. A method for electrically connecting multiple conductive surges in an electronic circuit package comprising the sequential steps of:

applying to a first substrate a first surface metal forming a first conductive surface;

applying lower dendrites to selected areas of the first surface metal;

applying a dielectric material to cover the first surface metal and the lower dendrites;

applying to a second substrate a second surface metal forming a second conductive surface;

applying second-level dendrites to selected areas of the second surface metal;

applying to the second substrate a third surface metal forming a third conductive surface;

applying third-level dendrites to selected areas of the third surface metal;

applying a dielectric material to cover the third surface metal and the third-level dendrites;

applying to a third substrate a fourth surface metal forming a fourth conductive surface;

applying upper dendrites to selected areas of the fourth surface metal;

compressively attaching the first substrate to the second substrate such that the lower dendrites are mated to the second-level dendrites; and compressively attaching the second substrate to the third substrate such that the third-level dendrites are mated to the upper dendrites.

2. The method of claim 1, wherein at least one substrate is made of glass-reinforced epoxy.

3. The method of claim 1, wherein at least one surface metal is made of a copper material.

4. The method of claim 1, wherein the steps of applying the dendrites further comprise:

applying a photoresist material to the area of surface metal;

exposing and developing the photoresist metal;

applying a layer of nickel to the surface metal;

applying a layer of palladium over the layer of nickel;

forming the dendrites on the palladium layer by ultrasonic plating of palladium; and removing the photoresist material.

5. The method of claim 1, wherein the dendrites are formed to a height of approximately 1 mil.

6. The method of claim 1, wherein the dendrites are made of palladium material.

7. The method of claim 1, wherein the dielectric material is an epoxy based adhesive.

8. The method of claim 1, wherein the dielectric material is selected from a group comprising BT-resin, polyimide, Teflon, and polysiloxanes.

9. The method of claim 1, wherein the dielectric material is applied by vacuum lamination.

* * * * *